United States Patent [19]

Mahmood et al.

[11] Patent Number: 5,764,525

[45] Date of Patent: *Jun. 9, 1998

[54] METHOD FOR IMPROVING THE OPERATION OF A CIRCUIT THROUGH ITERATIVE SUBSTITUTIONS AND PERFORMANCE ANALYSES OF DATAPATH CELLS

[75] Inventors: Mossaddeq Mahmood, San Jose; Balmukund K. Sharma, Santa Clara, both of Calif.; Arnold Ginetti, Antibes; Francois Silve, Le Canney, both of France

[73] Assignee: VLSI Technology, Inc., San Jose, Calif.

[ * ] Notice: The term of this patent shall not extend beyond the expiration date of Pat. No. 5,426,591.

[21] Appl. No.: 442,290

[22] Filed: May 16, 1995

Related U.S. Application Data

[63] Continuation-in-part of Ser. No. 188,292, Jan. 28, 1994, Pat. No. 5,426,591.

[51] Int. Cl.⁶ ..................................................... G06F 15/00
[52] U.S. Cl. ........................... 364/488; 364/487; 364/490; 364/491
[58] Field of Search ........................... 395/500, 700; 364/578, 488, 489, 490, 491, 580, 801; 371/22.2, 24, 22.3, 22.1

[56] References Cited

U.S. PATENT DOCUMENTS

| | | | |
|---|---|---|---|
| 4,791,578 | 12/1988 | Fazio et al. | 364/488 |
| 5,027,355 | 6/1991 | Stoica | 364/488 |
| 5,191,541 | 3/1993 | Landman et al. | 364/488 |
| 5,197,015 | 3/1993 | Hartoog et al. | 364/490 |
| 5,278,769 | 1/1994 | Bair et al. | 364/489 |
| 5,313,398 | 5/1994 | Rohrer et al. | 364/488 |
| 5,365,463 | 11/1994 | Donath et al. | 364/488 |
| 5,396,435 | 3/1995 | Ginetti | 364/489 |
| 5,418,931 | 5/1995 | Moorby | 364/578 |
| 5,463,563 | 10/1995 | Bair et al. | 364/488 |
| 5,487,018 | 1/1996 | Loos et al. | 364/490 |
| 5,491,640 | 2/1996 | Sharma et al. | 364/490 |
| 5,519,627 | 5/1996 | Mahmood et al. | 364/490 |
| 5,548,539 | 8/1996 | Vlach et al. | 364/488 |
| 5,572,437 | 11/1996 | Rostoker et al. | 364/489 |

*Primary Examiner*—Jacques H. Louis-Jacques
*Attorney, Agent, or Firm*—Flehr Hohbach Test Albritton & Herbert LLP; William S. Galliani

[57] ABSTRACT

A method of designing a circuit is described. A netlist for a circuit is generated. An analysis of the netlist is then executed to generate a set of cell instance performance values that characterize the performance of multiple gate instance-level components of the circuit in view of a selected parameter, such as circuit timing, circuit power consumption, or circuit area. Relying upon the set of cell instance performance values, a problematic component within the circuit is identified for replacement. A set of functionally equivalent candidate components are then identified. Each candidate component is analyzed with respect to the selected parameter. The analysis identifies an optimally performing candidate component. An instance of the optimally performing candidate component is then substituted into the netlist for the problematic component to improve the performance of the circuit.

8 Claims, 10 Drawing Sheets

METHOD FOR IMPROVING THE OPERATION OF A CIRCUIT THROUGH ITERATIVE SUBSTITUTIONS AND PERFORMANCE ANALYSES OF DATAPATH CELLS

This application is a continuation-in-part of Ser. No. 08/188,292, filed Jan. 28, 1994, now U.S. Pat. No. 5,426,591 entitled "Apparatus and Method for Improving the Timing Performance of a Circuit".

BRIEF DESCRIPTION OF THE INVENTION

This invention relates generally to computer aided design systems for designing integrated circuits. More particularly, this invention relates to a computer aided design system and method for improving the timing performance of selectively identified nodes of an integrated circuit.

BACKGROUND OF THE INVENTION

Application Specific Integrated Circuits (ASICs) are designed using a variety of Computer Aided Design (CAD) tools. The development of ASICs with CAD tools is often referred to as Electronic Design Automation (EDA).

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both.

The structural description of an integrated circuit is also referred to as a netlist. A netlist is a list of components and interconnections between the components. A netlist is hierarchical when any component in the netlist is itself a netlist.

At the logical level, the behavioral description is specified using boolean equations. The structural description is represented as a netlist of primitive cells. Examples of primitive cells are full-adders, NAND gates, latches, and D-Flip Flops.

At the RTL level, the behavioral description consists of program-like constructs, such as, variables, operators, conditionals, loops, procedures and functions. The structural description is a netlist of high-level macrocell components, such as adders, pipelined multipliers, ALUs, multiplexors, and register-files. This macrocell is also referred to as a datapath cell. Each macrocell or datapath cell has a corresponding netlist of primitive cells and a corresponding pre-designed custom layout. This logic-level netlist of primitive cells, and the custom layout are generated using a silicon compiler tool. The timing and pin capacitance information of this logic-level netlist is required for analyzing the timing of a RTL level netlist.

A silicon compiler accepts as inputs a netlist composed of interconnected macrocells and produces as output a netlist composed of interconnected primitive cells, and a custom layout.

The functional relationships between several commonly used CAD tools is depicted in FIG. 1. One such CAD tool is an RTL Synthesizer 22. An RTL synthesizer 22 accepts as input an RTL description 24 of a design, written in an HDL language, such as VHDL or Verilog, and produces as output a netlist 26. The netlist 26 comprises a list of circuit components and the interconnections between the components. More particularly, the netlist 26 generated by the RTL synthesizer 22 is a hierarchical netlist composed of logic-level netlists (i.e., netlists of primitive cells) and RTL level netlists (i.e., netlists of datapath cells). The primitive cells, such as NAND gates, XOR gates and D-Flip-Flops, are obtained from a cell library 30. The area, timing and pin capacitance information of each primitive cell is also available from the cell library 30. The datapath cells, such as ALUs, adders and register files, are obtained by the RTL synthesizer 22 from a datapath library 38.

Other CAD tools may be used to verify that the circuit described in the netlist meets timing requirements or other constraints. For example, a logic synthesizer/timing analyzer 28 may be used to optimize the netlist for such purposes. When the netlist 26 is composed of logic-level netlists only, a logic synthesizer/timing analyzer 28 may analyze the timing of the netlist 26 using the timing constraints 32 and the timing and pin capacitance information of each primitive cell available from the cell library 30, and finally may produce an optimized netlist 36 with better timing performance than the original netlist 26.

The logic synthesizer/timing analyzer 28 may perform spatial optimization to decrease the area of a circuit defined by the netlist. The logic synthesizer/timing analyzer 28 may also operate to insure that the designed circuit meets a set of timing constraints 32. An integrated circuit may have specified timing constraints that define the maximum permissible time periods between receipt of a particular set of input signals and the generation of output signals on specified output nodes of the circuit. The timing performance of a circuit is a function of the delays through the logic gates of the circuit, wiring capacitances, input connector drive strengths, and output connector loads. The propagation times are computed by a timing analyzer built in the logic synthesizer/timing analyzer 28.

Prior art timing analyzers assess the timing performance of a circuit on the basis of a logic-level analysis. In other words, the timing analyzer determines timing performance by analyzing the primitive cells of the circuit; the timing analyzer does not directly determine the timing performance of the datapath cells (RTL components or macrocells), for which accurate timing information is not available in the datapath library 38. Based upon this logic-level analysis, the logic synthesizer/timing analyzer 28 modifies the logic-level netlist in order to insure that the circuit meets all specified constraints.

In these prior art methods, the circuit's netlist is modified at the logic-level only, but the RTL level netlist, if any, remains the same. Thus, prior art RTL synthesizers do not have accurate timing information for the RTL level netlist. In other words, datapath cell timing information is not available to the RTL synthesizer 22 when it is mapping the HDL description of a circuit to RTL components. Thus, prior art RTL synthesizers are unable to improve the timing performance of the RTL level circuit for a given timing constraint.

Since prior art timing analyzers rely upon logic-level information, it is difficult to analyze the circuit design at the datapath cell level. Thus, it would be desirable to facilitate the analysis of a netlist composed of RTL and logic-level components. It would also be desirable to provide a method and apparatus for modifying a circuit at the RTL level. Such a capability would allow analyses of area and timing tradeoffs that are not available with logic-level modifications. For example, at an RTL level, the architecture of a 64-bit adder can be easily changed from a ripple carry (slow and small) architecture to a carry look-ahead (fast and large) architecture to drastically improve the timing performance of critical paths.

After the logic synthesizer/timing analyzer 28 optimizes the netlist, there are a number of commercially available "silicon compilers", sometimes called "datapath compilers" or "place and route tools" 34, that may then be used to convert the optimized netlist 36 into a semiconductor circuit layout. The semiconductor circuit layout may then be used to manufacture the circuit.

SUMMARY OF THE INVENTION

The invention is an apparatus and method for designing an integrated circuit. A netlist is generated to characterize a circuit. An analysis of the netlist is then executed to generate a set of cell values that characterize the performance of multiple gate instance-level components of the circuit in view of a selected parameter, such as circuit timing, circuit power consumption, or circuit area. Relying upon the set of cell values, a problematic component within the circuit is identified for replacement. A set of functionally equivalent candidate components are then identified. Each candidate component is analyzed with respect to the selected parameter. The analysis identifies an optimally performing candidate component. The optimally performing candidate component is then substituted into the netlist for the problematic component to improve the performance of the circuit.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
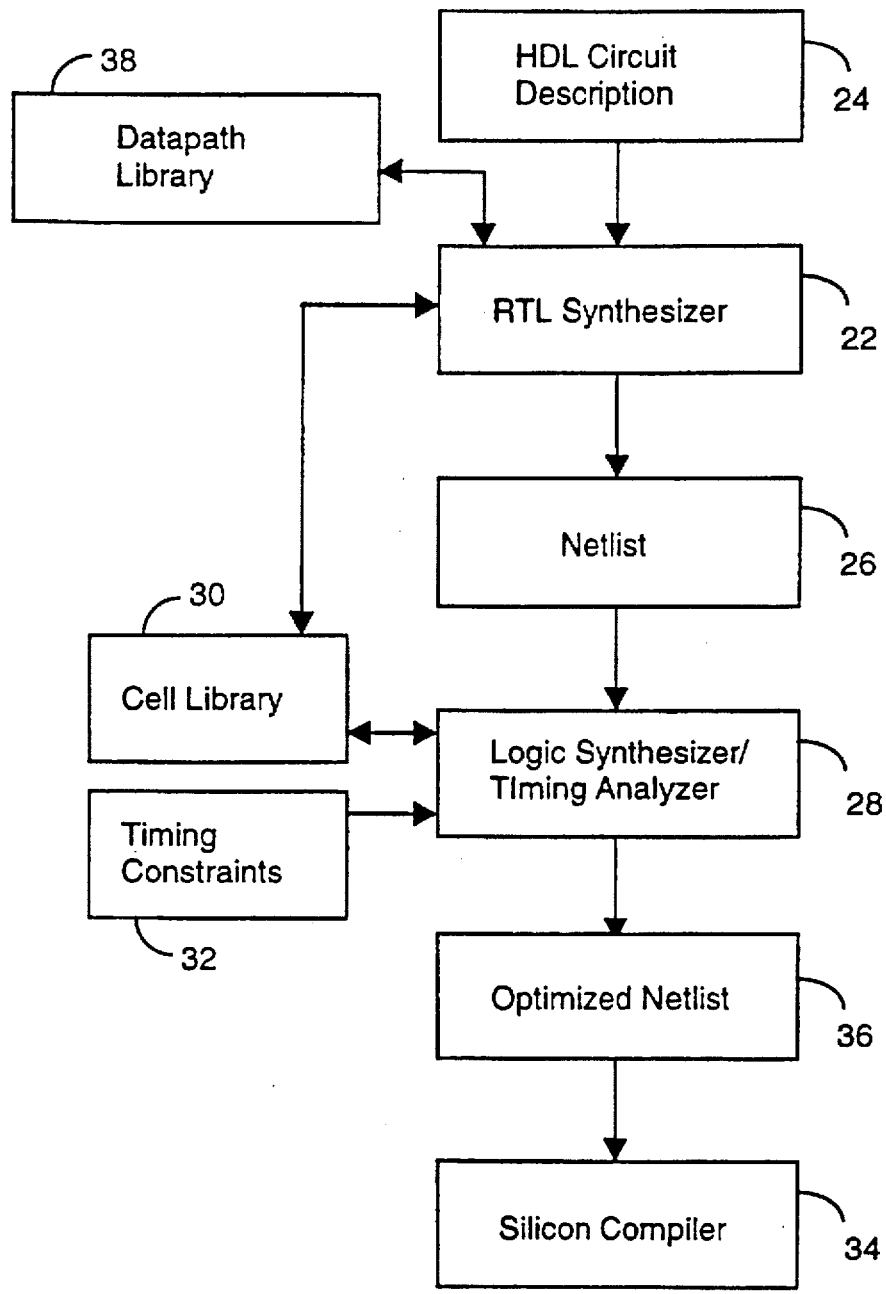
FIG. 1 depicts the processing steps associated with prior art electronic design automation techniques that use a logic-level timing verifier.
Figure 2:
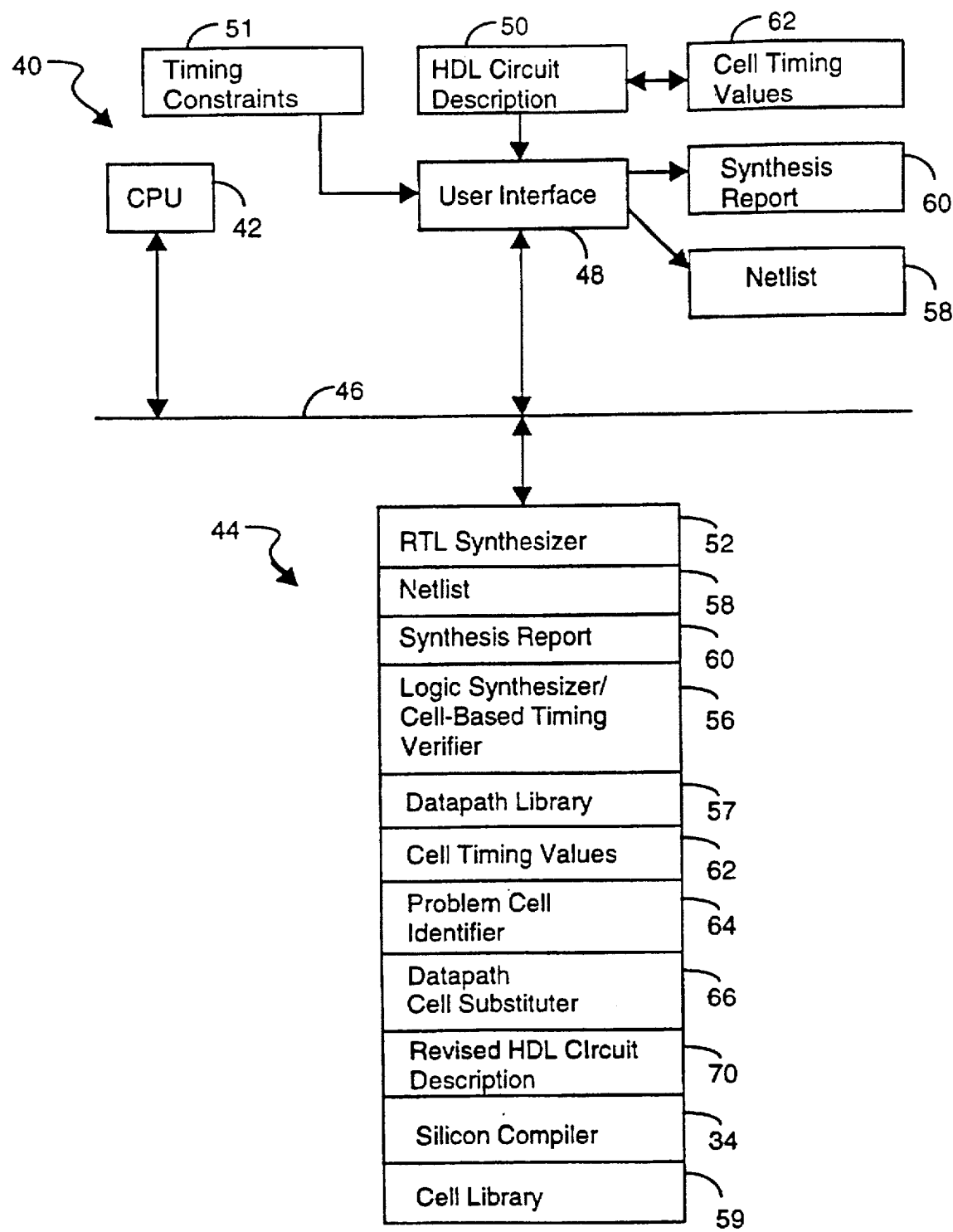
FIG. 2 depicts an apparatus that may be used in accordance with the present invention.

FIG. 2 depicts an apparatus that may be used to execute the method of the present invention. The apparatus 40 includes a central processing unit (CPU) 42 that communicates with a memory module 44 over a bus 46. The CPU 42, memory module 44, and bus 46 are standard computing elements widely known in the art. The memory module 44 may be RAM, ROM, or disc memory. As will be described below, the memory module 44 stores coded programs for executing the method of the present invention. The apparatus 40 also includes a user interface 48 that may include any type of input device, such as a keyboard or monitor; the user interface 48 may also include any type of output device, such as a computer monitor or printer.

An HDL description 50 of a circuit to be designed is entered into the apparatus 40 through the user interface 48. Timing constraints 51 for the circuit are also entered into the apparatus 40 through the user interface 48. As will be more fully described below, the HDL circuit description 50 is processed by a RTL synthesizer 52 that uses a datapath library 57 and a cell library 59 to generate a netlist 58 and a synthesis report 60. As depicted in the figure, the synthesis report 60 and netlist 58 may be accessed through the user interface 48.

The netlist 58 is processed by a cell-based timing verifier of the logic synthesizer/cell-based timing verifier 56. As will be described herein, the cell-based timing verifier 56 analyzes the circuit at the datapath cell (also called macrocell or RTL component) level and automatically reports the timing at the datapath cell level. The cell-based timing verifier then generates cell timing values 62. The cell timing values 62 are processed in accordance with the invention (they may also be accessed by an engineer through the user interface 48). Specifically, a problem cell identifier 64 analyzes the datapath cell timing values 62. Based upon this analysis, a datapath cell substituter 66 modifies the HDL circuit description 70. As will be described below, the HDL circuit description 70 may be re-synthesized and re-coded until all circuit constraints are met. When the circuit meets all constraints, it is conveyed to a silicon compiler 34 for routing and placement, in accordance with prior art techniques.

Figure 3:
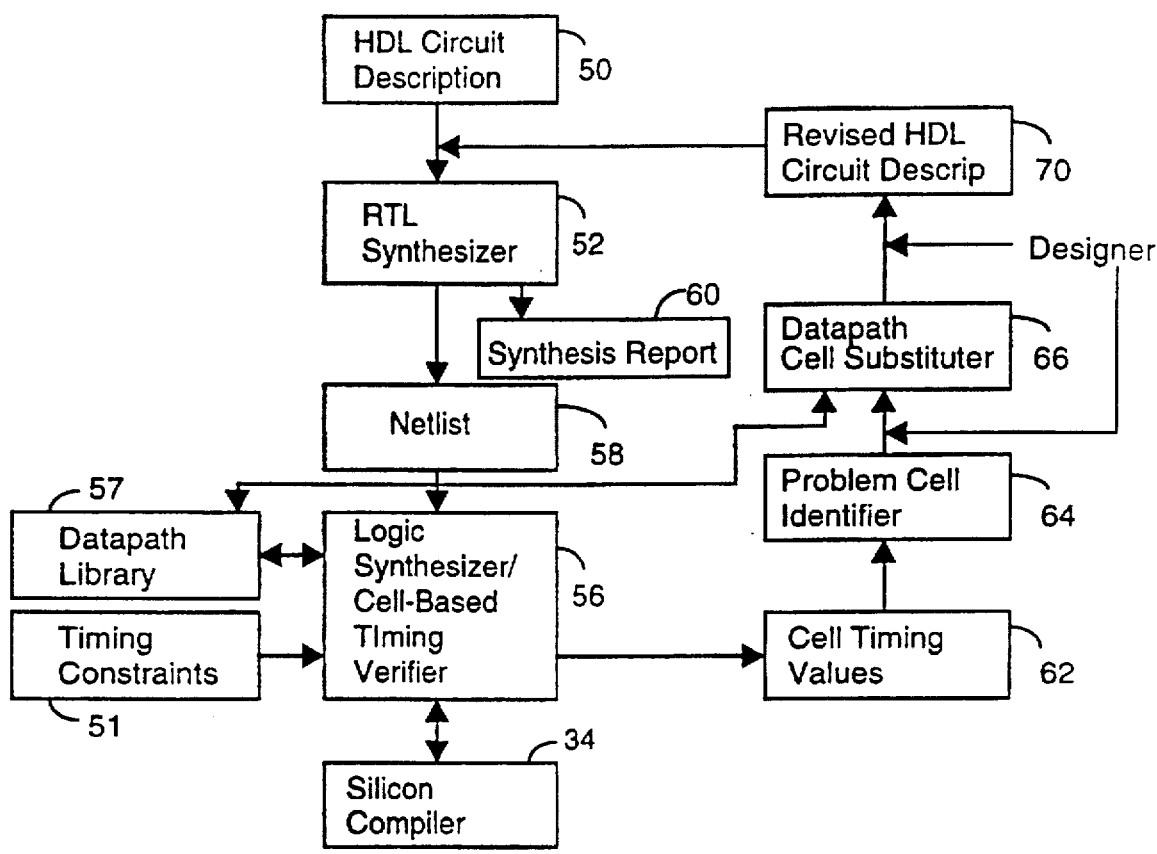
FIG. 3 depicts the processing associated with designing a circuit in accordance with the present invention.

FIG. 2 provides a depiction of the apparatus used in accordance with the invention. The discussion corresponding to FIG. 2 provides an overview of the operation of the invention. FIG. 3 provides a more detailed representation of the process of the invention, as executed on the apparatus of FIG. 2. As identified in FIG. 3, an HDL description of a circuit 50 is conveyed to an RTL synthesizer 52. The following computer code is an example of an HDL description for a segment of a circuit:

| | |
|---|---|
| entity design1 is | (1) |
|     port (clk:in bit; | (2) |
|         xi,yi,zi:in bit_vector(3 downto 0); | (3) |
|         rst:in bit; | (4) |
|         ou1,ou2:out bit_vector(3 downto 0)); | (5) |
| end design1; | (6) |
| architecture behavior of design1 is | |
|   --compass maxdelay 10 | (7) |
| signal x,y:bit_vector(3 downto 0); | (8) |
| begin | (9) |
|   ou1 <= x; | (10) |
|   ou2 <= y; | (11) |
|   process | (12) |
|     variable temp: bit_vector(3 downto 0); | (13) |
|   begin | (14) |
|     wait until clk'event and clk = '1'; | (15) |
|     if rst = '0' then | (16) |
|       temp:= xi + yi; | (17) |
|       x <= temp + zi; | (18) |

```
        y <= xi - yi;                    (19)
      else                                (20)
        temp:= xi - yi;                   (21)
        x <= temp - zi;                   (22)
        y <= xi + yi;                     (23)
      end if;                             (24)
    end process                           (25)
end behavior                              (26)
```

The first line of code introduces the parameters for a circuit entity ("Design1"). Lines (2) through (5) define the input and output ports for the architecture. Specifically, there are two one-bit input ports ("clk" and "rst"), three four-bit input ports ("xi", "yi", "zi"), and two four-bit output ports ("ou1", "ou2").

The seventh line of code introduces the circuit architecture "behavior" for entity "design1". Note that the double-dash ("—") is generally used to isolate documentation explaining the code. In this instance, the double-dash is followed by a special character string ("Compass") that informs the RTL synthesizer 52 that the information that follows must be considered by the RTL synthesizer 52 and the logic synthesizer 54 during performance optimization. Specifically, a maximum delay for the circuit ("maxdelay") is defined at 10 nanoseconds.

Intermediate signal values ("x","y") are defined at line (8). The processing loop begins at line (9). The output signals ("ou1", "ou2") are respectively defined in relation to the intermediate signal values ("x","y"). A variable ("temp") is defined at line (13). Line (15) defines a condition that will initiate processing of the input signals. Specifically, there must be a clock event ("clk'event") and the clock signal must be high ("clk='1'"). In other words, there must be a clock signal transition from a low to a high state.

Line (16) defines a logic condition. If the input bit reset is zero ("rst='0'"), then the logic at lines (17) through (19) is executed (temp:=xi+yi; x<=temp +zi; y <=xi-yi). Otherwise, the logic of lines (21) through (22) is executed (temp:=xi-yi; x <=temp-zi; y<=xi+yi). Then by executing lines (10) and (11), the values of "ou1" and "ou2" are assigned the values of "x" and "y", respectively. Lines (24) through (26) close loops and de-mark the end of the RTL behavioral description of the circuit.

The foregoing code provides an example of a portion of a circuit and how that circuit portion is characterized in a Hardware Description Language (HDL). An RTL synthesizer 52 may now be used to synthesize the HDL circuit description 50. RTL synthesizers 52 are known in the art. RTL synthesizers convert an HDL description of a circuit into a netlist 58. A netlist 58 is a list of circuit components and the interconnections between those components. Thus, an RTL synthesizer 52 accesses a datapath library 57 to identify circuit components that can perform the logic specified in the HDL circuit description. These components, and the connections between them, are then embodied in a netlist 58.

The RTL synthesizer 52 of the present invention provides an additional feature: a synthesis report 60. The synthesis report 60 describes the circuit elements selected to execute the HDL circuit 50, the size of the circuit elements, the total propagation time for the resultant circuit, and other parameters. An exemplary synthesis report 60 corresponding to the previous HDL circuit description is as follows:

```
DATAPATH NAME: design1_dp1                           (1)
DATAPATH WIDTH: 4                                    (2)
AREA SUMMARY:                                        (3)
                  Num      Width       Total         (4)
  Cell Name       Insts    Per Cell    Width         (5)
  VDP5ASB002      3        113         339           (6)
  VDP3DFF001      2        51          102           (7)
DATAPATH HEIGHT: 113                                 (8)
RESOURCE ALLOCATION REPORT:                          (9)
  INSTANCE: ASB51, ELEMENT: VDP5ASB002              (10)
  Ops implemented: 2                                (11)
  Op: 1, context:                                   (12)
    design1: x <= temp + zi;                        (13)
  Op: 2, context:                                   (14)
    design1: x <= temp - zi;                        (15)
  INSTANCE: ASB53, ELEMENT: VDP5ASB002              (16)
  Ops implemented: 2                                (17)
  Op: 1, Context:                                   (18)
    design1: temp := xi - yi;                       (19)
  Op: 2, Context:                                   (20)
    design1: temp := xi + yi;                       (21)
  INSTANCE: A5B54, ELEMENT: VDP5ASB002              (22)
  Ops implemented: 2                                (23)
  Op: 1, Context:                                   (24)
    design1: y <= xi + yi;                          (25)
  Op: 2, Context:                                   (26)
    design1 x <= xi - yi;                           (27)
  Final Estimated Time 22.6 ns                      (28)
```

The first line of the report identifies the datapath of the circuit as "design1_dp1". The second line of the code indicates that the datapath width is "4", corresponding to the input and output signals that are four bits wide. Line 3 introduces a summary of the physical area occupied by the circuit. Lines 6 and 7 identify the components that are used in the circuit and area information related to the components. For example in line 6, the component "VDP5ASB002" is used 3 times, as indicated by the heading that identifies the number of instances ("Num Insts"). The width of each component is 113 microns and the total width is 339 microns.

Line 9 introduces a description of the allocation of resources within the circuit. Line 10 indicates that one component in the circuit is an addition/subtraction component. The component is referred to as an instance ("INSTANCE ASB51"), of an element ("ELEMENT VDP5ASB002"). The "element" is obtained from the datapath library 57, and is identified as "ELEMENT VDP5ASB002". The foregoing HDL circuit description is merely a portion of a larger circuit. In the large circuit (only a portion of which is described here), there are many instances of other circuit elements not listed in the above abbreviated synthesis report.

The datapath library 57 maintains complete information on every component in the library, component information will include component logic, the number of gates, the height, the width, the power consumption, the area, the pin description, etc. The functional operation performed by the component is identified in the synthesis report. For example line 11 states that the component implements two operations. The two operations are identified at line 13 ("x<= temp+zi") and at line 15 ("x<=temp−zi").

The remaining lines of the synthesis report follow the same pattern. The last line of the report provides an estimate of the signal propagation time through the circuit.

Figure 4:
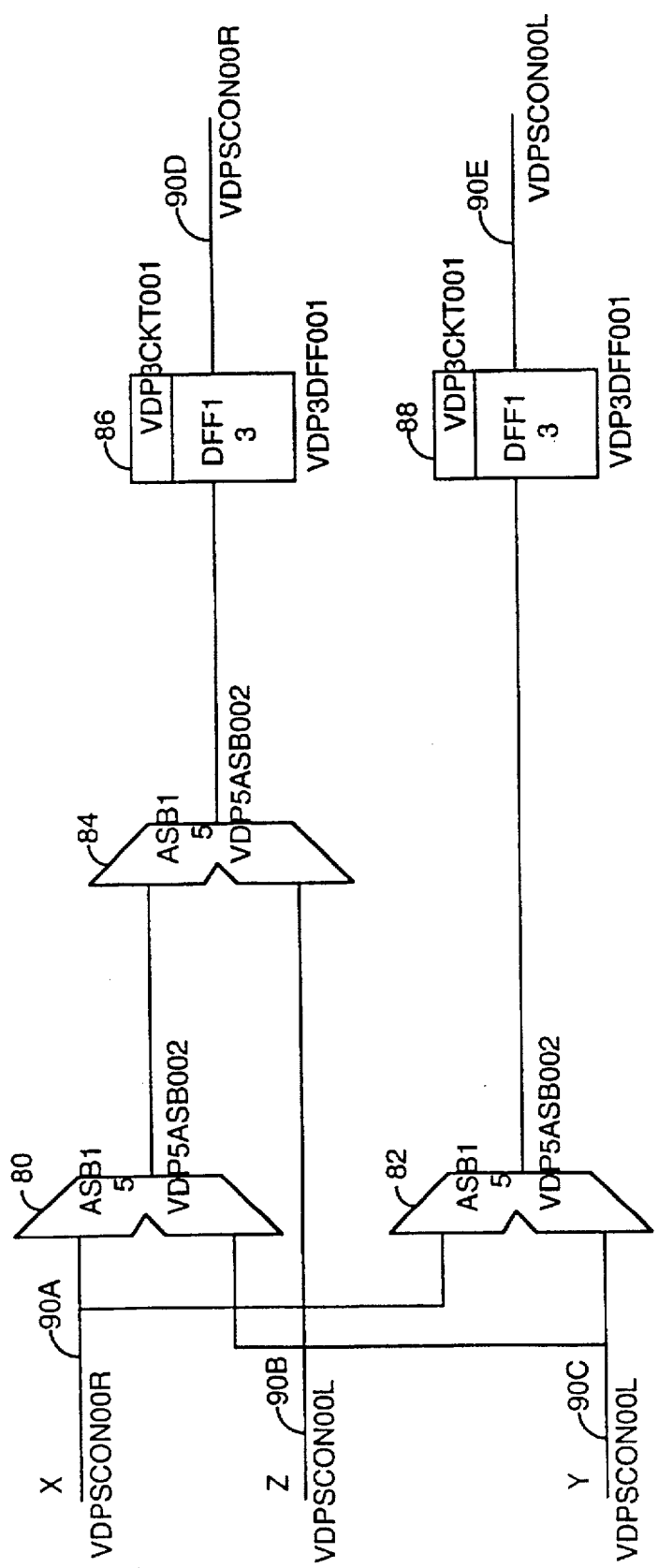
FIG. 4 is a schematic of a circuit designed in accordance with the invention wherein the circuit components are identified by datapath cell names.
Figure 5:
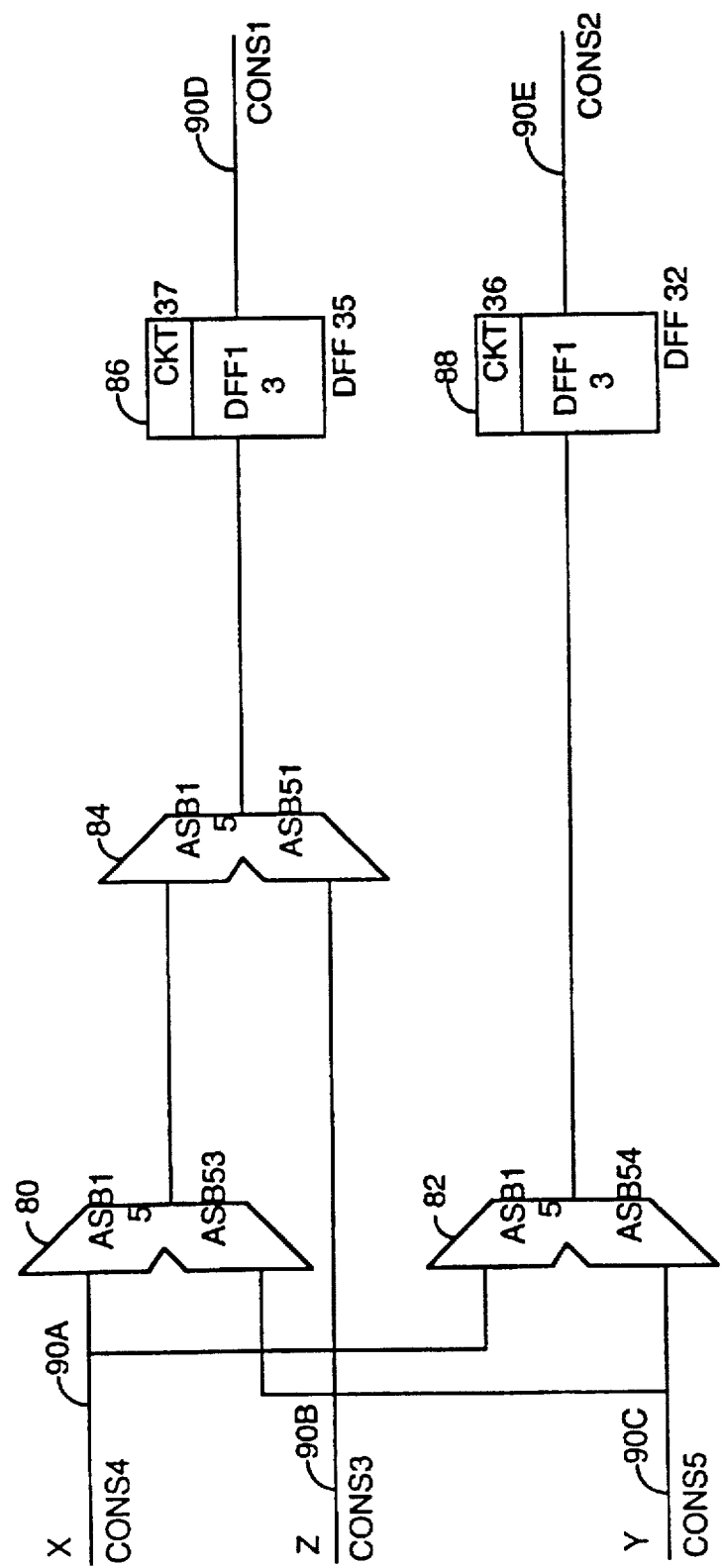
FIG. 5 is a schematic of a circuit designed in accordance with the invention wherein the circuit components are identified by instance names.

An example of a segment of an HDL circuit 50 has been provided. An example of a synthesis report 60 corresponding to the HDL circuit 50 has also been provided. FIGS. 4 and 5 depict schematics corresponding to the HDL circuit 50 and the synthesis report 60.

FIG. 4 identifies the different circuit components by their "cell", "element", or "component" names. Thus, addition/subtraction unit 80 is identified as "VDP5ASB002", its "element" or "cell" name in the datapath library 57. Addition/subtraction elements 82, 84 have the same names. FIG. 4 also includes two D-type flip-flops 86, 88. Each flip-flop is identified as "cell" or "element" "VDP3DFF001". Recall that line 7 of the synthesis report identified these elements. FIG. 4 also includes a variety of connectors 90 to link the different circuit elements. Each connector 90 is identified through its name; for example, connector 90A is identified through name "VDPSCON00R".

FIG. 5 corresponds to FIG. 4, but instead of identifying the circuit components by "cell" or "element" names, the schematic identifies the circuit components by their "instance" names. Thus, addition/subtraction unit 80 is identified as "ASB53", connector 90A is identified as "CONS4", flip-flop 86 is identified as "DFF35", etc.

Returning to FIG. 3, the netlist 58 is conveyed to a logic synthesizer/cell-based timing verifier 56. As previously stated, the netlist 58 includes a complete description of the circuit components and their interconnections. In contrast, the synthesis report 60 includes only the circuit components.

Timing constraints 51 are provided to the cell-based timing verifier of the logic synthesizer/cell-based timing verifier 56. The timing constraints 51 simply define time propagation limits for the signals in the circuit.

Instead of determining propagation delays at the gate level, the cell-based timing verifier of the invention utilizes the timing information associated with each datapath cell component. Thus, for example, turning to FIG. 4, the cell-based timing verifier would sum the propagation delays associated with the datapath cells in each path of the circuit. One such path in FIG. 4 includes the connector 90A ("VDPSCON00R"), adder-subtractor 80 ("VDP5ASB002"), addition-subtractor 84 ("VDP5ASB002"), flip-flop 86 ("VDP3DFF001") and connector 90D ("VDPSCON00R"). Prior art timing analyzers sum the values for all the gates in the path.

The timing information is derived from the inherent characteristics of the components in the signal path and by the nature of the interconnections between the components in the signal path. The inherent characteristics of the components are available from the datapath library 57. The interconnections between the components are defined by the netlist. Specifically, the following criteria may be used to derive timing information. The delay values for a circuit node may be defined as a pair of a Rising_delay and a Falling_delay where: Rising_delay=propRise+(rampRise * capacitive_load) and Falling_delay=propFall+(rampFall * capacitive_load). The capacitive load for a circuit node (or, equivalently, for a component's output pin) is the output capacitance of that pin plus the input capacitance of all pins connected to it. The "propRise" value is the time it takes for a signal to propagate through a component and arrive at a valid HIGH level. The "rampRise" value defines the rate at which a HIGH signal rises in a component. The "propFall" value is the time it takes for a signal to propagate through a component and arrive at a valid LOW level. The "rampFall" value is the rate at which a LOW signal falls in a component. The capacitive parameters depend upon interconnections while the remaining parameters are contingent upon the component's inherent characteristics, as set forth in the datapath library 57. The computed delay factor may be refined by adding a setup-and-hold value representing the time that a stable value must be held by the component.

The foregoing considerations for establishing a delay value for a gate of a circuit are known in the art. The utilization of these factors in the present invention to define delay values for datapath circuit components and then relying upon the datapath circuit delay values to make design decisions is believed to be novel.

Figure 6:
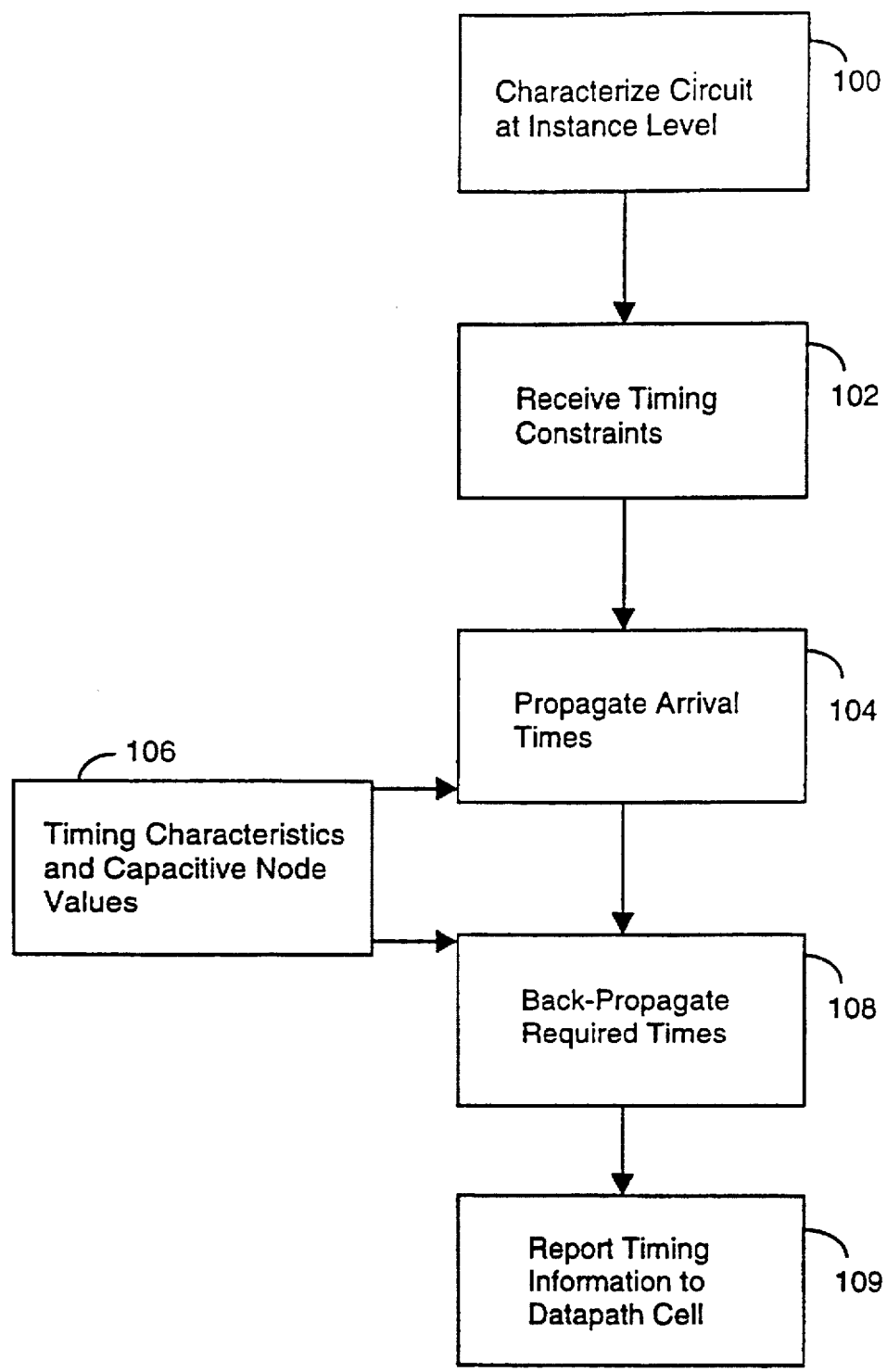
FIG. 6 depicts the processing steps associated with a cell-based timing verifier in accordance with the present invention.

FIG. 6 describes the processing associated with the cell-based timing verifier 56 of the invention. The first step associated with the timing verifier is to characterize the circuit at the instance level (block 100). This is done by invoking the silicon compiler 34 to generate the logic-level description from the datapath cells (also called macrocells and RTL components) instantiated in the RTL netlist synthesized by the RTL synthesizer 52. For example, FIG. 5 describes the circuit at the instance level. Note that prior art timing verifiers characterize the circuit at the gate level, and not at the datapath cell level.

The next processing step associated with the timing verifier 56 is to receive timing constraints (block 102). The timing constraints establish when certain signals in the circuit must be present at given locations within the circuit. The next processing step is to propagate input arrival times for each component within the circuit (block 104). The arrival times are established by timing characteristics and capacitive node values (block 106), as described above. The next processing step associated with the timing verifier of the invention is to back-propagate required output times for each component within the circuit (block 108). The difference between the arrival time and the required time is the slack value. The arrival time plus the output delay time represents the total time required to propagate a signal to and through a given circuit component. The final step is to report the timing information from the primitive cell (also called logic) level to the datapath cell (also called macrocell or RTL component) level (block 109). In other words, all gate level timing information for a given datapath cell is collected by the timing verifier 56 to yield a total delay time value for the given datapath cell.

The cell-based timing verifier yields a list of cell timing values 62. An exemplary list of cell timing values follows:

| Instance CONS1 of cell VDPSCON00R | | | | (1) |
|---|---|---|---|---|
| Connector | Arrival Time | Required Time | Slack | (2) |
| i | 2.86 | 8.67 | 5.81 | (3) |
| Instance CONS2 of cell VDPSCON00L | | | | (4) |
| Connector | Arrival Time | Required Time | Slack | (5) |
| i | 2.86 | 8.67 | 5.81 | (6) |
| Instance CONS3 of cell VDPSCON00L | | | | (7) |
| Connector | Arrival Time | Required Time | Slack | (8) |
| i | −1.08 | −.47 | .62 | (9) |
| Instance CONS4 of cell VDPSCON00R | | | | (10) |
| Connector | Arrival Time | Required Time | Slack | (11) |
| i | −.78 | −4.94 | 4.16 | (12) |
| Instance CONS5 of cell VDPSCON00L | | | | (13) |
| Connector | Arrival Time | Required Time | Slack | (14) |
| i | −.93 | −7.08 | −6.14 | (15) |
| Instance ASB51 of cell VDP5ASB002 | | | | (16) |
| Connector | Arrival Time | Required Time | Slack | (17) |
| a | 11.57 | 1.67 | −9.91 | (18) |
| b | −1.08 | −.47 | .62 | (19) |
| so | 18.13 | 8.67 | −9.45 | (20) |
| Instance DFF32 of cell VDP3DFF001 | | | | (21) |
| Connector | Arrival Time | Required Time | Slack | (22) |
| clockspec | | | | (23) |
| d | 12.47 | 8.67 | −3.79 | (24) |
| q | 2.86 | 8.67 | 5.81 | (25) |
| Instance ASB53 of cell VDP5ASB002 | | | | (26) |
| Connector | Arrival Time | Required Time | Slack | (27) |
| a | −.78 | −4.94 | −4.16 | (28) |
| b | −.93 | −7.08 | −6.14 | (29) |

-continued

| | | | | |
|---|---|---|---|---|
| so | 11.57 | 1.67 | −9.91 | (30) |
| Instance ASB54 of cell VDP5ASB002 | | | | (31) |
| Connector | Arrival Time | Required Time | Slack | (32) |
| a | −.78 | −4.94 | −4.16 | (33) |
| b | −.93 | −7.08 | −6.14 | (34) |
| so | 12.47 | 8.67 | −3.79 | (35) |
| Instance DFF35 of cell VDP3DFF001 | | | | (36) |
| Connector | Arrival Time | Required Time | Slack | (37) |
| clockspec | | | | (38) |
| d | 18.13 | 8.67 | −9.45 | (39) |
| q | 2.86 | 8.67 | 5.81 | (40) |

The foregoing cell timing values 62 include a description of each element of the circuit of FIG. 4 (and 5). For example, the first line of the cell timing values identifies the connector 90D. The second line includes a field "Required Time", which describes the time at which a signal is required at a specified cell.

The timing constraints 51 establish the "Required Time". The arrival time is indicated by the field "arrival time". The field "slack" describes the difference between the required arrival time and the computed arrival time for each cell instance. The "slack" field identifies problem areas in a circuit. Namely, the "slack" field with a negative value identifies the location at which the most detrimental signal delay is occurring. Line 3 of the foregoing cell timing values provides data for the instance defined in line 1. The timing information for connector 90E is defined at lines 4 through 6. The remaining connectors are defined at lines 7 through 15.

Line 16 defines the addition/subtraction unit 84 ("Instance ASB51 of cell VDP5ASB002"). Slack values are provided for both inputs to the element ("a" and "b") and also for the output of the element ("so"). Line 21 defines the flip-flop 88, while lines 22–25 define the parameters associated with the flip-flop 88. The remaining lines of the cell timing values characterize the other elements of the circuit in a similar fashion.

Returning to FIG. 3, the next step associated with the invention is to identify problem areas (block 66) within the circuit by studying the cell timing values, in particular the slack values. This operation is performed by a problem cell identifier 64. The problem cell identifier 64 may include a procedure that compares all of the slack values and identifies the largest individual negative slack value for a component. In the prior art, such an operation would not be feasible because timing information was not provided at the datapath (macrocell or RTL) component level. Instead, the timing information was provided for an entire circuit, based upon information derived from all of the gates forming the circuit.

The present invention utilizes timing information associated with high-level components of a datapath design. The higher-level timing information allows programmed criteria to change the datapath architecture. For instance, in the foregoing example it can be observed that the largest negative slack values are associated with addition/subtraction element 80 ("Instance ASB53 of cell VDP5ASB002"). An appropriate program can be used to identify the cell with the largest negative slack value.

The next step associated with the invention is to substitute datapath cells to obtain faster circuit performance. For example, the slower addition/subtraction unit 84 may be substituted by a faster datapath cell element which is available in the datapath library 57. A cell substituter 66 may be used to identify the logical operation of the addition/subtraction unit 84. The cell substituter 66 may then compare the logical operation with the resources in the datapath library 57 to determine which cell in the library could be used to enhance the time performance of the circuit. Scrutiny of the datapath library 57 of the present example would reveal that the element "VDP1ASB001" is faster than the element "VDP5ASB002". Thus, this faster element is substituted for its slower counterpart. The cell substituter 66 is implemented with appropriate computer code that compares logical operations and times values to identify an appropriate substitute element.

Substitution of cells results in a revised HDL circuit description (block 70). One technique for implementing the substitution of cells is to provide directives in the original HDL circuit description, an example of this technique follows:

| | |
|---|---|
| 30 entity design1 is | (1) |
| port (clk:in bit; | (2) |
| xi,yi,zi:in bit vector(3 downto 0); | (3) |
| rst:in bit; | (4) |
| ou1,ou2:out bit_vector(3 downto 0)); | (5) |
| end design1; | (6) |
| architecture behavior of design1 is | |
| −compass maxdelay 10 | (7) |
| signal x,y: bit_vector(3 downto 0); | (8) |
| begin | (9) |
| ou1 <= x; | (10) |
| ou2 <= y; | (11) |
| process | (12) |
| variable temp: bit_vector(3 downto 0); | (13) |
| begin | (14) |
| wait until clk'event and clk = '1'; | (15) |
| if rst = '0' then | (16) |
| temp:= xi + yi;−compass dp_cell VDP1ASB001 | (17) |
| x <= temp + zi; | (18) |
| y <= xi − yi; | (19) |
| else | (20) |
| temp:= xi − yi;−compass dp_cell VDP1ASB001 | (21) |
| x <= temp − zi; | (22) |
| y <= xi + yi; | (23) |
| end if; | (24) |
| end process | (25) |
| end behavior | (26) |

Note that at line (17) a specific directive is created to establish the cell element ("dp_cell VDP1ASB001") that is to be used to execute the given logical operation ("temp:= xi+yi). Similarly, a directive is provided at line (21).

In other embodiments of the present invention, the directive may use any predefined syntax recognized by the RTL synthesizer being used. The important feature is that a specific cell from the cell library is identified, prior to RTL synthesis, to execute a given HDL operation.

Regardless of the technique used to revise the HDL circuit description, the revised HDL circuit description is re-conveyed to the logic synthesizer 56. At this time, a new synthesis report 60 would result. The following represents a synthesis report consistent with the foregoing example:

| | | | | |
|---|---|---|---|---|
| DATAPATH NAME: design1_dp1 | | | | (1) |
| DATAPATH WIDTH: 4 | | | | (2) |
| AREA SUMMARY: | | | | (3) |
| | Num | Width | Total | (4) |
| Cell Name | Insts | Per Cell | Width | (5) |
| VDP5ASB002 | 3 | 113 | 339 | (6) |
| VDP3DFF001 | 2 | 51 | 102 | (7) |
| VDP1ASB001 | 1 | 292 | 292 | (8) |
| DATAPATH HEIGHT: 292 | | | | (9) |
| RESOURCE ALLOCATION REPORT: | | | | (10) |
| INSTANCE: ASB51, ELEMENT: VDP5ASB002 | | | | (11) |

-continued

```
Ops implemented: 2                                    (12)
Op: 1, context:                                        (13)
design1: x <= temp + zi;                              (14)
Op: 2, context:                                        (15)
design1: x <= temp - zi;                              (16)
INSTANCE: ASB13, ELEMENT: VDP1ASB001                  (17)
Ops implemented: 2                                    (18)
Op: 1, Context:                                        (19)
design1: temp:= xi - yi;--compass dp_cell             (20)
VDPLASB001
Op: 2, Context:                                        (21)
design1: temp:= xi + yi;--compass dp_cell             (22)
VDPLASB001
INSTANCE: ASB54, ELEMENT: VDP5ASB002                  (23)
Ops implemented: 2                                    (24)
Op: 1, Context:                                        (25)
design1: y <= xi + yi;                                (26)
Op: 2, Context:                                        (27)
design1 x <= xi - yi;                                 (28)
Final Estimated Time 20.4 ns                          (29)
```

Note that the area summary of the revised synthesis report includes a new datapath cell. Specifically, line 8 includes a reference to cell "VDP1ASB001". This same datapath cell is identified in a directive at lines 20 and 22 of the synthesis report. Line 29 indicates that the revised circuit now has a final estimated time of 20.4 ns, in contrast to the original estimation time of 22.6 ns.

Figure 7:
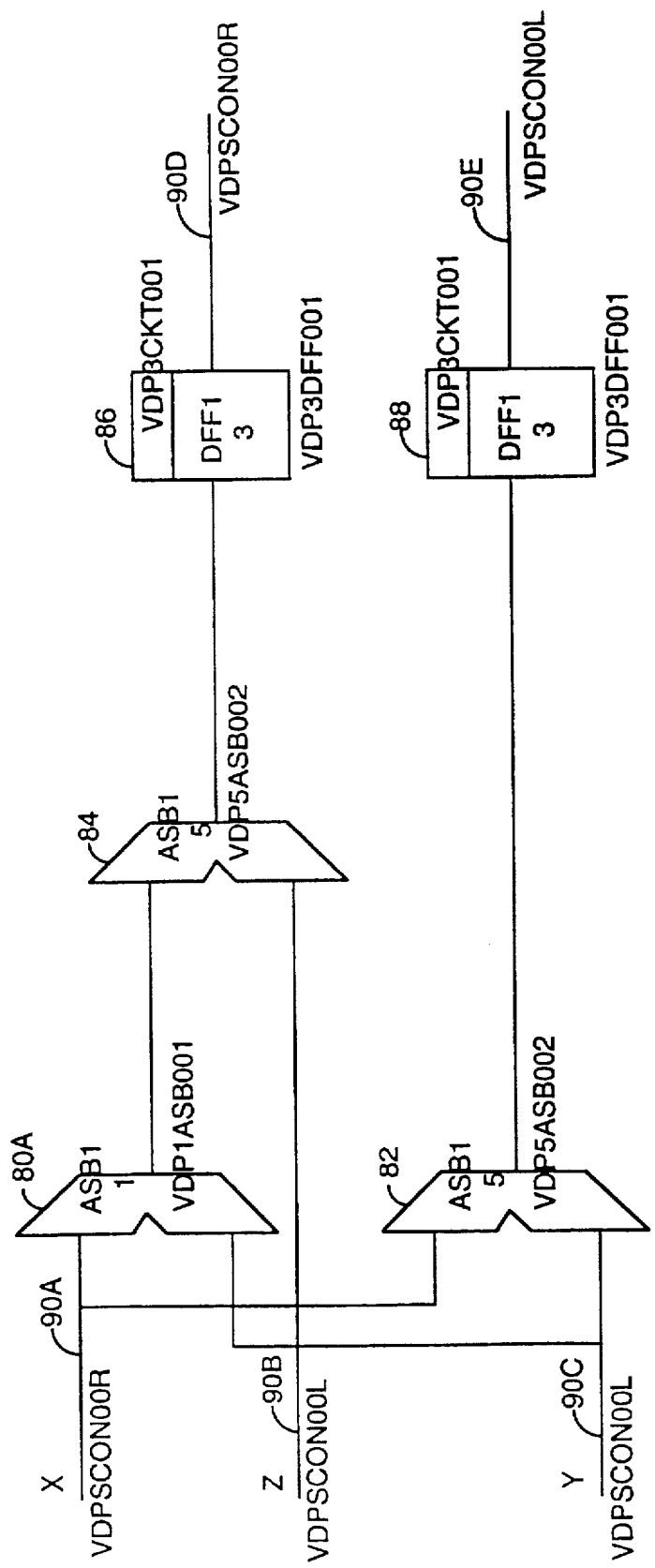
FIG. 7 depicts a schematic of the circuit of FIG. 4, but with an RTL circuit component that has been substituted into the circuit in accordance with the techniques of the invention.
Figure 8:
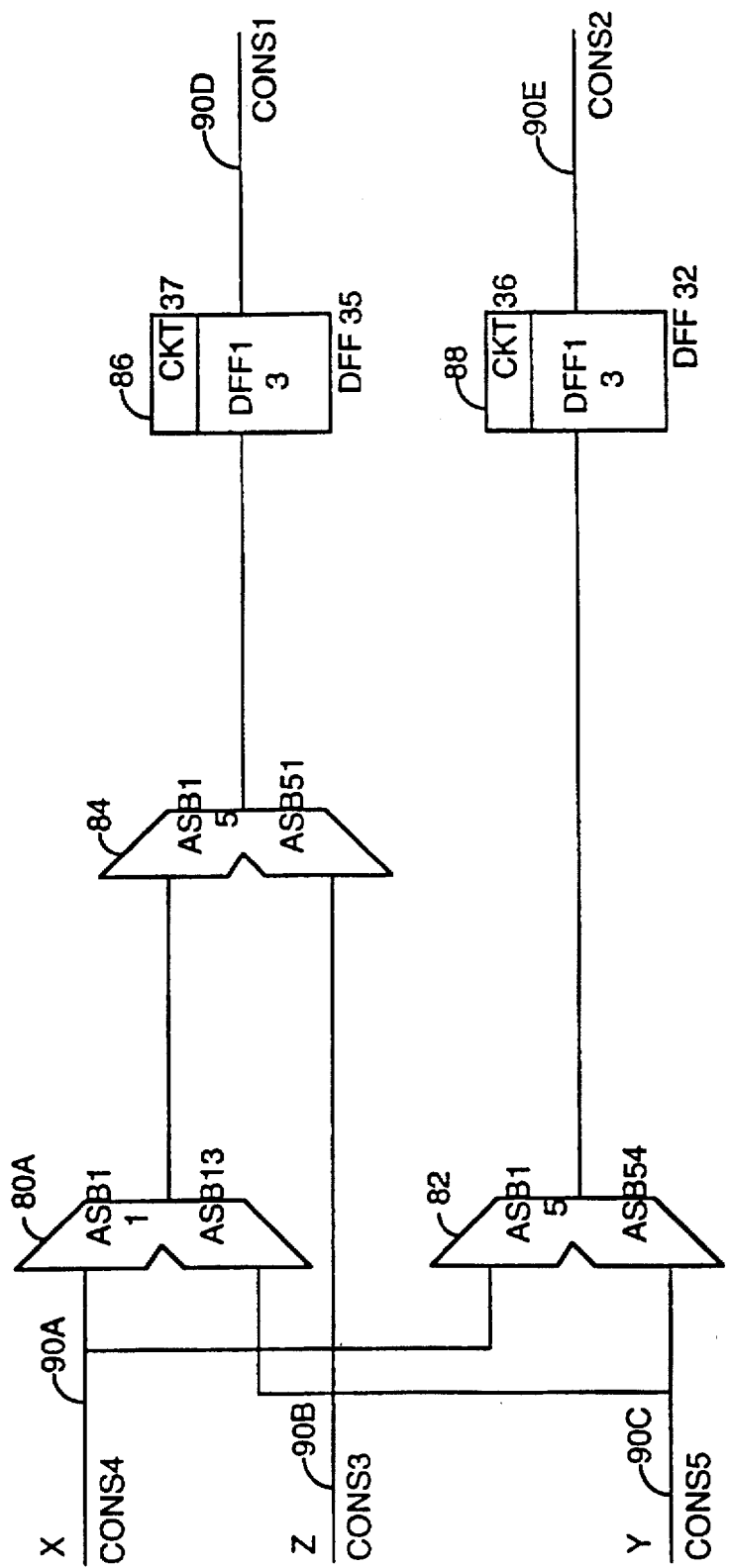
FIG. 8 depicts a schematic of the circuit of FIG. 5, but with an RTL circuit component that has been substituted into the circuit in accordance with the techniques of the invention.

The circuit schematics corresponding to these changes are provided in FIGS. 7 and 8. In FIG. 7, it can be seen that addition/subtraction unit 80A is now cell element "VDP1ASB001". FIG. 8 indicates that addition/subtraction unit 80A by its instance number ("ASB13").

The steps described in relation to FIG. 3 may be repeated until all time constraints are satisfied. Afterwards, the netlist 58 is fed to a silicon compiler (place and route tool) 34 for placement and routing of the circuit, in accordance with prior art techniques.

As shown in FIG. 3, a designer may modify the output from the problem cell identifier 64 and the datapath cell substituter 66. That is, a designer may select which cells to substitute and place an appropriate directive into the HDL circuit description.

It should be noted that techniques other than the ones described herein may be used to select cell substitutions. For instance, the datapath cell substituter 66 may consider all possible datapath cell substitutions along each critical path in the specified circuit and then select a datapath cell substitution that minimizes a predefined cost function. For instance, replacing a datapath cell early in a critical path with a faster datapath cell may resolve many timing problems further down the critical path, thereby reducing the number of datapath cell substitutions needed and also minimizing the resulting increase in the circuit's layout area. Alternatively, on each iteration of the cell substitution process, the datapath cell substituter might look for the datapath cell substitution that produces the largest circuit speed up for the least amount of circuit layout area increase. Another technique the datapath cell substituter 66 can utilize to increase circuit speed is to remove resource sharing along critical paths.

One skilled in the art will recognize that the techniques of the invention may be used to optimize parameters other than speed. For instance, substitute cells may be identified for the purposes of reducing power consumption, circuit area, the number of gates, etc. For example, circuit area may be reduced by selecting small area elements along non-critical paths.

Figure 9:
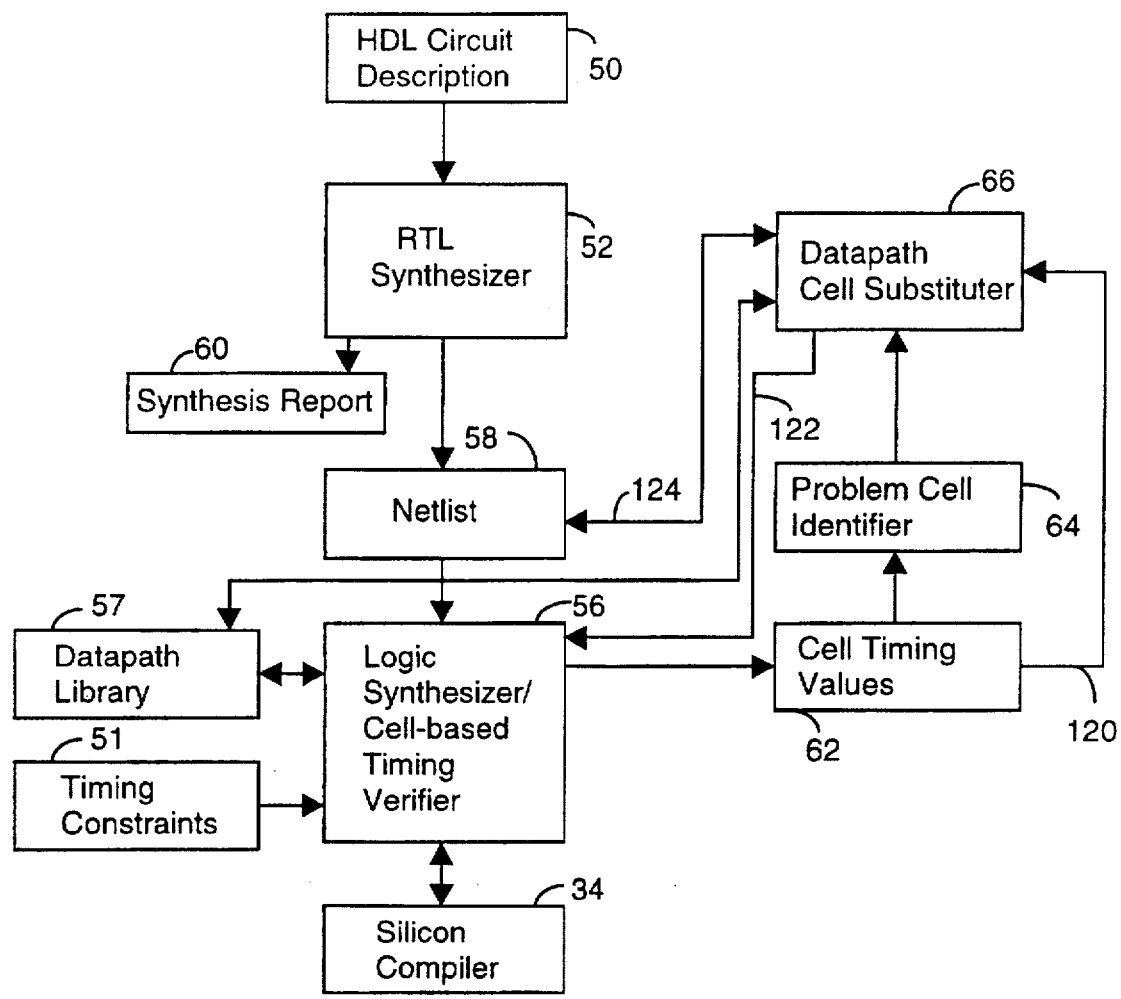
FIG. 9 depicts the processing associated with designing a circuit in accordance with an alternate embodiment of the present invention.

Attention presently turns to one alternate embodiment of the invention that has been successfully implemented. FIG. 9 illustrates an embodiment of the invention generally corresponding to the embodiment of the invention shown in FIG. 3. The major distinction between the two embodiments is that in the embodiment of FIG. 9, the datapath cell substituter 66 produces a new netlist, instead of a revised HDL circuit description, as shown in FIG. 3.

Another important feature associated with the embodiment of the invention shown in FIG. 9 is that the datapath cell substituter 66 controls an operation wherein a set of candidate datapath cells are processed by the timing verifier 56. Resultant cell performance values associated with each candidate datapath cell are then analyzed by the datapath cell substituter 66 in view of predetermined criteria. Based upon this information, the cell substituter 66 selects and substitutes a single suitable candidate datapath cell into the netlist to provide a revised netlist. The revised netlist is functionally equivalent to the original netlist, but its performance is optimized in accordance with the predetermined criteria.

The processing sequence associated with the datapath cell substituter 66 can be generally described as follows. Initially, the problem cell identifier 64 identifies a problematic datapath cell instance with substandard performance characteristics. The problematic datapath cell instance is reported to the datapath cell substituter 66. As will be described below, the datapath cell substituter 66 identifies a set of candidate cells to replace the problematic datapath cell instance. As shown by line 122, the datapath cell substituter 66 passes a first candidate datapath cell (which is a netlist of primitive cells) to the timing verifier 56 for processing. This step is performed by replacing the problematic datapath cell instance in the design netlist by an instance of the first candidate cell which is a netlist functionally equivalent to the problematic datapath cell, but has different performance characteristics. The timing verifier 56 produces cell timing values 62 corresponding to the first candidate datapath cell. The cell timing values are derived by analyzing the timing behavior of the modified design netlist and the gate level characteristics of the datapath cell. After analysis, the modified netlist is restored by putting back the problematic datapath cell instance in the design netlist.

Once the cell timing values 62 for the first candidate cell are generated, control returns to the datapath cell substituter 66, as shown by line 120, thereby bypassing the problem cell identifier 64. As will be described below, the datapath cell substituter 66 processes the cell timing values and then passes a second candidate datapath cell, if one exists, to the timing verifier 56. The second candidate datapath cell is processed as the first candidate datapath cell discussed above. After all candidate datapath cells have been processed, a substitute datapath cell is selected from the set of candidate datapath cells to replace the problematic datapath cell if this replacement improves the performance of the circuit with respect to a trade-off analysis of speed, area and other criteria. This results in a new netlist, as shown by line 124. The new netlist may then be processed by the logic synthesizer/cell-based timing verifier 56. Ultimately, the new netlist may be placed and routed by the silicon compiler 34.

Figure 10:
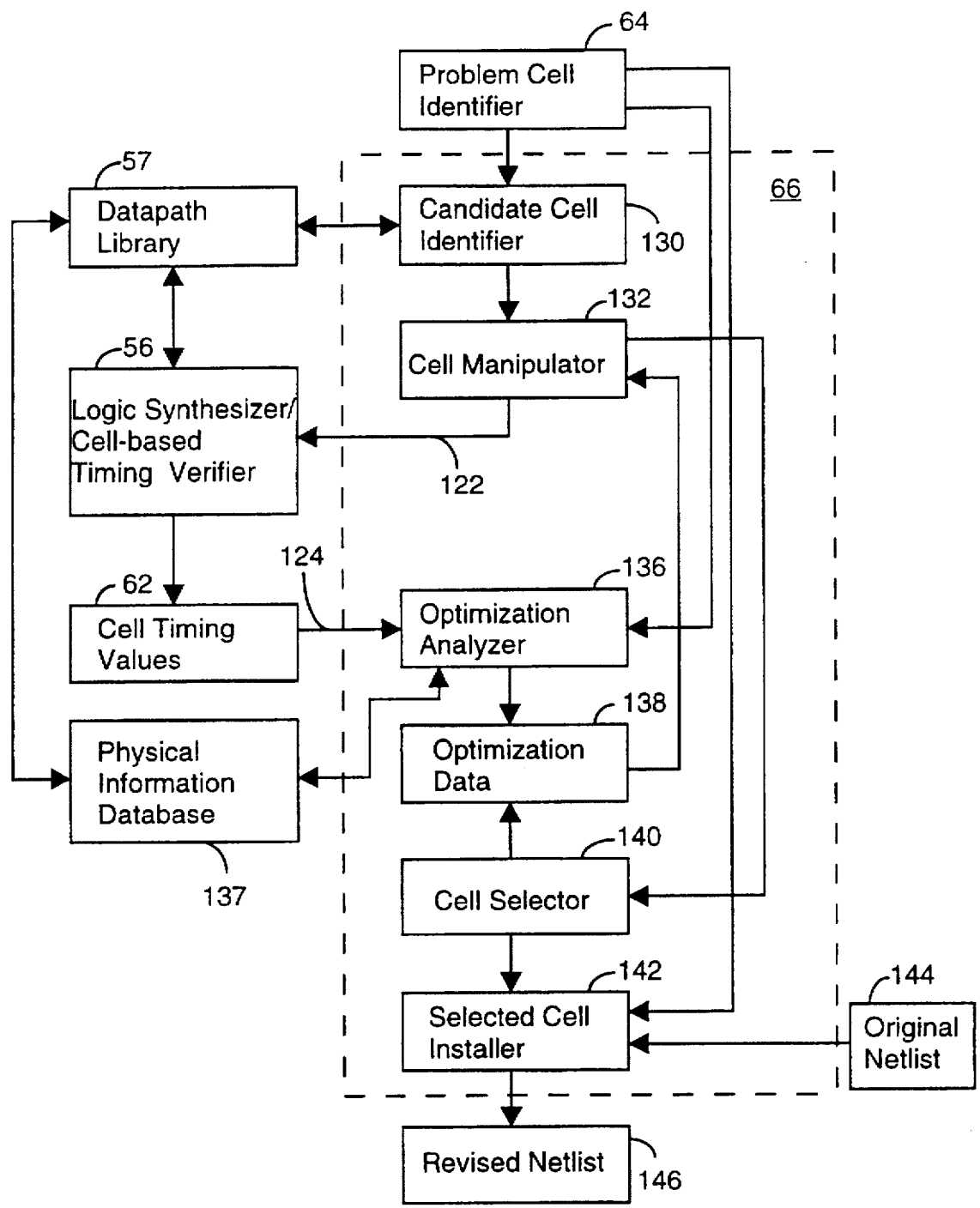
FIG. 10 illustrates the operations associated with the datapath cell substituter used in the embodiment of the invention depicted in FIG. 9.

The operations associated with the embodiment of FIG. 9 are more fully appreciated with reference to FIG. 10. FIG. 10 illustrates the detailed operations associated with the datapath cell substituter 66. In addition, FIG. 10 illustrates the functional relationship between the datapath cell substituter 66 and the other functional components shown in FIG. 9.

The problem cell identifier 64 identifies a problematic datapath cell in the design netlist. Relying upon the example given above, the problematic cell may be the cell with the largest negative slack value. The problem cell identifier 64 may be implemented as computer code that sorts the cell timing values by slack values. In this embodiment, the problem cell identifier 64 generates a list of datapath cells sorted by slack values, the largest negative slack value being at the top of the list. The largest negative slack value at the top of the list has a corresponding datapath cell instance, which is designated as the problematic datapath cell instance.

The problematic cell instance is passed to a candidate cell identifier of the datapath cell substituter 66. The candidate cell identifier accesses the datapath library 57 to find every element in the datapath library 57 that performs an identical function as the problematic cell. The identified elements are referred to herein as candidate datapath cells or candidate cells. Each candidate cell is a netlist of primitive cells. Thus, a candidate cell is composed of several gates, and is a multiple gate instance-level component. Techniques to find candidate cells to functionally match a specified cell are known in the art. One such technique is described in the patent application entitled: "Improved Datapath Synthesis Method and Apparatus Utilizing a Structured Cell Library", Ser. No. 07/877,951, filed May 1, 1992, which is owned by the assignee of the present invention and is expressly incorporated by reference herein. The tree-pattern matching techniques described in that application may be utilized by the candidate cell identifier 130 to locate all cells in the datapath library 57 that perform the same function as the problematic cell. Other techniques may also be used to identify functionally equivalent candidate cells.

The set of candidate cells found by the candidate cell identifier 130 are passed to a cell manipulator 132. The cell manipulator may be implemented as computer code that receives the list of candidate cells and sequentially passes each candidate cell to the timing verifier 56. This is achieved by temporarily replacing the problematic datapath cell instance by an instance of each candidate cell. After all candidate cells have been passed to the timing verifier 56, the cell manipulator 132 calls the cell selector 140.

As will be described below, after the cell manipulator 132 passes a first candidate cell to the timing verifier 56, processing of the first candidate cell ultimately results in optimization data (block 138). The cell manipulator 132 is then called after the optimization data is stored. The cell manipulator 132 then passes a second candidate cell to the timing verifier 56. This sequence of operations is repeated until every candidate cell is processed, whereupon the cell manipulator 132 calls a cell selector 140, whose operation will be discussed below. Attention presently turns to the processing that is executed after the cell manipulator 132 passes a candidate cell to the timing verifier 56.

Each candidate cell is processed by the logic synthesizer/cell-based timing verifier 56. As previously indicated, each candidate cell represents a netlist of gate-level components. Timing operations are executed at the gate-level, but the cell timing values are reported at the datapath cell (or instance) level. The cell timing values 62 are bit-level pin-to-pin timing values. Specifically, the cell timing values 62 for the candidate cell may include an arrival time, a required time, and a slack value. These timing values are then passed to an optimization analyzer 136.

The optimization analyzer 136 assesses the cell timing values in relation to other physical attributes associated with the candidate cell. For example, the optimization analyzer 136 may execute a cost function that assesses such factors as the timing attributes of the cell in relation to the physical area of the cell or the power consumption of the cell. Physical attributes associated with a selected cell may be obtained through a physical information database 137. The physical information database includes information regarding physical attributes of all cells in the datapath library 57. Thus, the physical information database 137 is used to access area or power consumption information corresponding to the candidate cell. For example, the physical information database 137 may sum all of the area values for each gate-level component of the candidate cell to provide a composite area value for the candidate cell. A suitable physical information database 137 for use in conjunction with the invention is described in the patent application entitled: "Electronic Design Automation Apparatus and Method Utilizing a Physical Information Database", Ser. No. 08/106,104, filed Aug. 13, 1993, which is assigned to the assignee of the present application and which is expressly incorporated by reference herein.

The cost function executed by the optimization analyzer 136 is tailored for a particular physical attribute that is to be optimized. For example, if speed is to be optimized, but only in light of area considerations, the cost function may be specified as follows: if the candidate cell is faster than the problematic cell, then the candidate cell should substitute the problematic cell, unless the speed improvement provided by the candidate cell is beneath a specified speed improvement threshold and the area increase of the candidate cell exceeds a specified area threshold. This cost function may be implemented in pseudo code with the following procedure:

| | |
|---|---|
| (1) | isNewDpcellBetter (problematicCell, candidateCell, |
| (2) | oldArea, newArea, oldSlackCost, newSlackCost) |
| (3) | timingImprovement:= newSlackCost − oldSlackCost; |
| (4) | extraArea:= newArea − oldArea; |
| (5) | if timingImprovement >= 0 |
| (6) | then |
| (7) | begin |
| (8) | if extraArea < 0 |
| (9) | then return (TRUE) |
| (10) | else |
| (11) | if timingImprovement < timeThreshold AND |
| (12) | extraArea > areaThreshold |
| (13) | then return (FALSE) |
| (14) | else return (TRUE) |
| (15) | end |
| (16) | else return (FALSE) |

The procedure isNewDpCellBetter is a boolean procedure, returning a true or false value. The input parameters to the procedure are within the parentheses of lines (1) and (2). Line (3) calculates the timing improvement associated with the candidate cell, while line (4) calculates the extra area (or area increase) associated with the candidate cell.

An if-then-else loop begins at line (5). If the substitute cell provides improved timing performance, then the block of logic between lines (6) and (15) is performed. If there is no timing improvement associated with the candidate cell, then a false value is returned, as shown at line (16).

As shown at lines (8)–(9), if there is a timing improvement and a space improvement with the new cell, then a true value is returned. On the other hand, as shown at lines (10)–(13), if the timing improvement does not exceed a specified threshold and the extra area of the candidate cell exceeds an area threshold, then a false value is returned. Otherwise, a true value is returned, as shown at line (14).

The results produced by the optimization analyzer 136 constitute optimization data 138. The optimization data may include the identification of a candidate cell, physical information associated with the candidate cell, and computed cost function values associated with the candidate cell. The optimization data may be cumulative data generated for all optimization analyses. On the other hand, the optimization data may be limited to information solely on the datapath cell to be substituted into the netlist. For example, in this context, if the optimization analysis concludes that the problematic cell instance should still be used, then the optimization data merely constitutes information on the problematic cell instance. On the other hand, if the optimization analysis concludes that the problematic cell should be replaced with an instance of the candidate cell, then the optimization data constitutes information on the substitute cell. In the latter case, future optimization analyses are executed in relation to the substitute cell instance that has replaced the problematic cell instance.

As previously indicated, after the optimization analyzer 136 produces optimization data 138, the cell manipulator 132 is invoked for processing of subsequent candidate cells. When all subsequent candidate cells have been processed in the manner described, the cell selector 140 is called.

The cell selector 140 accesses the stored optimization data 138. If the optimization data is implemented as a set of datapath cell information from all the optimization analyses, then the cell selector 140 process all the data to find the single datapath cell with the best performance characteristics. If the optimization data is implemented as a single datapath cell that has performed better than all other datapath cells from the optimization analyses, then the cell selector 140 merely selects that single datapath cell. In either embodiment, the selected single datapath cell is referred to as a selected cell.

The selected cell from the cell selector 140 is passed to the selected cell installer 142. The selected cell installer 142 inserts an instance of the selected cell into the netlist at the location of the problematic cell. The selected cell installer 142 may be implemented as a set of computer code that receives as input the original netlist 144, the problematic cell instance from the problem cell identifier 64, and the selected cell from the cell selector 140. The problematic cell is identified by an instance name and a set of connections to other circuit components. Through programming instructions, the selected cell installer 142 can identify these connections in the netlist, disconnect them from the problematic cell instance, and connect them to the selected cell. Thus, the output of the selected cell installer 142 is a revised netlist with the problematic cell instance replaced by an instance of the candidate cell. This operation results in a revised netlist 146. The revised netlist may then be further processed by the logic synthesizer/cell-based timing verifier 56 or it may be passed to the silicon compiler 34 for placement and routing.

The embodiment of FIGS. 9 and 10 has now been fully described. To further illuminate the operation of this embodiment of the invention, a simple example is provided. Suppose the problem cell identifier 64 identifies an instance of a datapath cell dpsub001h as a problematic cell instance in a netlist. The datapath cell dpsub001h has a high density architecture and performs a subtraction operation. This cell is then passed to the candidate cell identifier 130. The candidate cell identifier 130 identifies, in datapath library 57, another datapath cell, dpsub001s, which is a high-speed subtractor architecture that is capable of performing the same subtraction operation. The candidate cell identifier 130 then passes the candidate datapath cell, dpsub001s, to the cell manipulator 132, which in turn passes it to the timing verifier 56. The timing verifier produces the following cell timing values: dpsub001s, worst slack cost 5.50048 nanoseconds, total slack cost 82.60651 nanoseconds. The worst slack cost value characterizes the worst slack value of the design netlist corresponding to the candidate cell instance. The total slack cost value is the total cost value for the design netlist corresponding to the candidate cell instance. This information is then passed to the optimization analyzer 136. For the purpose of future discussion, only the total slack value will be considered, although it should be appreciated that similar processing can be performed in relation to the worst slack value, or a combination of the worst slack and total slack values.

The optimization analyzer 136 accesses the physical information database 137 to obtain information regarding the total area of the candidate cell dpsub001s. The physical information database 137 sums all of the area information for each component within the candidate cell to obtain a composite area value. In this case, the height is the same for all components and all candidate datapath cells. Thus, the composite area value is divided by the cell height to obtain a composite width value of 35350 microns.

The optimization analyzer 136 processes similar information in regard to the problematic cell. In particular, the optimization analyzer 136 receives slack values for the problematic cell from the problem cell identifier 64. In addition, the optimization analyzer 136 obtains area information for the problematic cell from the physical information database 137. This processing results in the following values: dpsub001h, total slack cost 82.58411 nanoseconds, width=18127 microns.

The optimization analyzer 136 may then execute the following operations, consistent with the cost function and associated pseudo code discussed above.

| Timing Improvement | = | newSlackCost − OldSlackCost (dpsub001s) (dpsub001h) |
|---|---|---|
| | = | 82.60651 − 82.58411 |
| | = | 0.02240 nanoseconds |
| Extra Area | = | NewArea − OldArea (dpsub001s) − (dpsub001h) |
| | = | 35350 − 18127 |
| | = | 17223 microns |

In this embodiment, the extra area or area increase is defined with respect to cell width since the height is the same for all candidate datapath cells. Since the timing improvement is a positive number (faster circuit) and the extra area is a positive number (area has increased), lines (11)–(14) of the pseudo code are executed. Assuming that the time threshold is set at 0.05 nanoseconds and the area threshold is set at 15000 microns, then the procedure isNewDpCellBetter would return a false value because the statement of lines (11)–(13) (if timingImprovement<timeThreshold AND extraArea>areaThreshold then return (FALSE)) is satisfied. In other words, the cost function indicates that the speed improvement associated with the candidate cell does not justify the cost of a large increase in cell size. Thus, the optimization data 138 could simply constitute information regarding the problematic cell, which up to this point, is still the best option. The required information on the problematic cell includes the cells identification (dpsub001h), its area or width, and its slack values. Note that in the absence of the specified cost function, the candidate cell (dpsub001s) would have been selected in a strict time analysis because it has slightly better timing performance.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of designing a circuit, said method comprising the steps of:

generating a netlist of a circuit;

executing an instance-level analysis of said netlist to generate a set of performance values that characterize the performance of multiple gate instance-level components of said circuit in view of a selected parameter;

identifying, through reliance upon said set of performance values, a problematic multiple gate instance-level component of said circuit for replacement;

identifying a set of candidate multiple gate instance-level components, each of which is functionally equivalent to said problematic multiple gate instance-level component;

analyzing each of said candidate multiple gate instance-level components in view of a cost function for a predetermined criteria to identify an optimally performing candidate multiple, gate instance-level component; and creating a new netlist by replacing said problematic multiple gate instance-level component with said optimally performing candidate multiple gate instance-level component that improves the performance of said circuit with respect to said predetermined criteria of said cost function.

2. The method of claim 1 wherein said generating step includes the step of generating said netlist from a hardware description language description of a circuit.

3. The method of claim 1 wherein said selected parameter is selected from the list including circuit timing, circuit power consumption, and circuit area.

4. A method of designing a circuit, said method comprising the steps of:

generating a netlist of a circuit;

executing an instance-level timing analysis of said netlist to generate a set of cell timing values that characterize the performance of multiple gate instance-level components of said circuit;

identifying, through reliance upon said set of cell timing values, a problematic multiple gate instance-level component of said circuit for replacement;

identifying a set of candidate multiple gate instance-level components, each of which is functionally equivalent to said problematic multiple gate instance-level component;

analyzing each of said candidate multiple gate instance-level components in view of a cost function for a predetermined criteria to identify an optimally performing candidate multiple gate instance-level component; and creating a new netlist by replacing said problematic multiple gate instance-level component with said optimally performing candidate multiple gate instance-level component that improves the timing performance of said circuit with respect to said predetermined criteria of said cost function.

5. The method of claim 4 wherein said generating step includes the step of generating said netlist from a hardware description language description of a circuit.

6. The method of claim 4 wherein said analyzing step includes the step of analyzing each of said candidate multiple gate instance-level components with a cell-based timing verifier.

7. The method of claim 6 wherein said analyzing step includes the step of analyzing the performance of said candidate multiple gate instance-level components in view of a cost function that assesses circuit timing and circuit area performance tradeoffs.

8. The method of claim 4 wherein said set of cell timing values of said executing step include a plurality of slack values corresponding to said multiple gate instance-level components of said circuit.

* * * * *